(12) United States Patent
Yamamoto et al.

(10) Patent No.: US 7,723,211 B2
(45) Date of Patent: May 25, 2010

(54) METHOD FOR JOINING ADHESIVE TAPE TO SEMICONDUCTOR WAFER AND METHOD FOR SEPARATING PROTECTIVE TAPE FROM SEMICONDUCTOR WAFER

(75) Inventors: Masayuki Yamamoto, Ibaraki (JP); Satoshi Ikeda, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 17 days.

(21) Appl. No.: 12/166,127

(22) Filed: Jul. 1, 2008

(65) Prior Publication Data

US 2009/0011525 A1    Jan. 8, 2009

(30) Foreign Application Priority Data

Jul. 2, 2007 (JP) .............................. 2007-174112

(51) Int. Cl.
    *H01L 21/00* (2006.01)
(52) U.S. Cl. ................................. 438/462; 257/E21.53
(58) Field of Classification Search ................ 156/247, 156/60, 64, 349, 391, 510; 438/464, 118, 438/401, 7, 107, 343, 106, 460, 16, 976; 700/114, 110, 121; 702/35, 94, 95, 150, 702/151; 382/151, 145, 149; 257/E21.53
See application file for complete search history.

(56) References Cited

U.S. PATENT DOCUMENTS

2009/0009755 A1* 1/2009 Yamamoto et al. ....... 356/237.5

FOREIGN PATENT DOCUMENTS

JP    2002-124494 A    4/2002

* cited by examiner

*Primary Examiner*—Thomas L Dickey
*Assistant Examiner*—Nikolay Yushin
(74) *Attorney, Agent, or Firm*—Cheng Law Group, PLLC

(57) ABSTRACT

An arithmetic processing part in a controller detects a position of a defect such as a chip or a crack that occurs at an outer periphery of a semiconductor wafer, and then a memory in the controller stores position information of the defect. The controller reads the position information of the defect through a network in each process. On the basis of this position information, the controller determines a direction of joining a dicing tape to the semiconductor wafer or a direction of separating a protective tape from a front face of the semiconductor wafer.

8 Claims, 6 Drawing Sheets

METHOD FOR JOINING ADHESIVE TAPE TO SEMICONDUCTOR WAFER AND METHOD FOR SEPARATING PROTECTIVE TAPE FROM SEMICONDUCTOR WAFER

BACKGROUND OF THE INVENTION (1) Field of the Invention

The present invention relates to a method for joining and separating an adhesive tape such as a protective tape to and from a pattern formation side of a semiconductor wafer.

(2) Description of the Related Art

A chip component is fabricated from a semiconductor wafer (hereinafter, appropriately referred to as a "wafer") in the following manner. For example, a circuit pattern is formed on a front face of a wafer, and then a protective tape is joined to the front face of the wafer. Thereafter, a back face of the wafer is subjected to a grinding process (back grinding) such that the wafer has a small thickness. The wafer having the small thickness is attached to and held by a ring frame through a dicing tape. Thereafter, the protective tape is separated from the front face of the wafer, and then the wafer is transported to a dicing process (refer to, for example, JP-A 2002-124494).

As described above, the processing for the semiconductor wafer involves joining or separating various adhesive tape, such as joining the protective tape to the semiconductor wafer, joining the semiconductor wafer to the dicing tape and separating the protective tape from the semiconductor wafer.

In a case where the semiconductor wafer is subjected to the processing of joining or separating such an adhesive tape, however, since a strength of the semiconductor wafer is insufficient due to its small thickness, there is a high risk of a damage of the semiconductor wafer due to a stress applied to the wafer when the adhesive tape is joined to/separated from the wafer. In particular, a minute chip or crack occurs at an outer periphery of the wafer in the back grinding. In such a case, there is a high possibility that the chip or the crack becomes deteriorated due to the stress applied to the wafer when the adhesive tape is joined to/separated from the wafer.

SUMMARY OF THE INVENTION

A principal object of the present invention is to provide a method capable of suitably joining and separating an adhesive tape to and from a semiconductor wafer with less influence of a chip or a crack that occurs at an outer periphery of the semiconductor wafer.

In order to achieve the object described above, the present invention adopts the following configuration:

A method for joining an adhesive tape to a semiconductor wafer, comprising the steps of:

detecting a position of defect occurring at an outer periphery of the semiconductor wafer, and then storing the position of the defect; and determining a direction of joining the adhesive tape to the semiconductor wafer on the basis of stored information of the defect position.

By this method according to the present invention, a wafer that has been subjected to back grinding is attached to and held by a ring frame through an adhesive tape (a dicing tape) in order to prepare a mount frame. In this case, a joining direction (a joining roller moving direction) is determined diametrical from a position except a position of a defect. Thus, it is possible to reduce a stress applied to the wafer when the adhesive tape is joined to the wafer and to prevent further deterioration of the defect such as a chip or a crack.

Preferably, the adhesive tape joining direction may be determined as follows.

For example, in a case where a plurality of defects are present at the outer periphery of the semiconductor wafer, the adhesive tape joining direction is determined diametrical from a position except a defect with a wider area, the defect being derived from a comparison among areas of the defects.

Moreover, in a case where the defect is a crack, the adhesive tape is joined from a position except the cracking, the position being defined as a joining start position, and the direction of joining the adhesive tape is determined parallel to a longitudinal direction of the crack.

In order to achieve the object described above, the present invention also adopts the following configuration:

A method for separating a protective tape from a semiconductor wafer, comprising the steps of:

detecting a position of a defect at an outer periphery of the semiconductor wafer, and then storing the position of the defect; and determining a direction of separating the protective tape from a pattern formation side of the semiconductor wafer on the basis of stores information of the defect position.

By the method according to the present invention, a separating tape is joined to a protective tape joined to a front face of a wafer and, almost simultaneously, is separated and collected. Thus, the protective tape can be separated together with the separating tape from the front face of the wafer. In such separation, a tape separating direction is determined diametrical from a position except the defect position. Thus, it is possible to prevent the defect such as a chip or a crack from becoming further deteriorated due to a tape separating stress and a pressing force of a tape guide member each applied to the wafer.

Preferably, the protective tape separating direction may be determined as follows.

For example, in a case where a plurality of defects are present at the outer periphery of the semiconductor wafer, the adhesive tape separating direction is determined diametrical from a position except a defect with a wider area, the defect being derived from a comparison among areas of the defects.

Moreover, in a case where the defect is a crack, the adhesive tape is separated from a position except the crack, the position being defined as a separating start position, the direction of separating the adhesive tape is determined parallel to a longitudinal direction of the crack.

As described above, the methods according to the present invention are effective at improving a yield in a process of manufacturing a semiconductor chip for the following reason that an adhesive tape can be joined to a semiconductor wafer or a protective tape can be separated from the semiconductor wafer with less influence of a defect such as a chip or a crack that occurs at an outer periphery of the semiconductor wafer.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Hereinafter, description will be given of one embodiment of the present invention with reference to the drawings.

Figure 1:
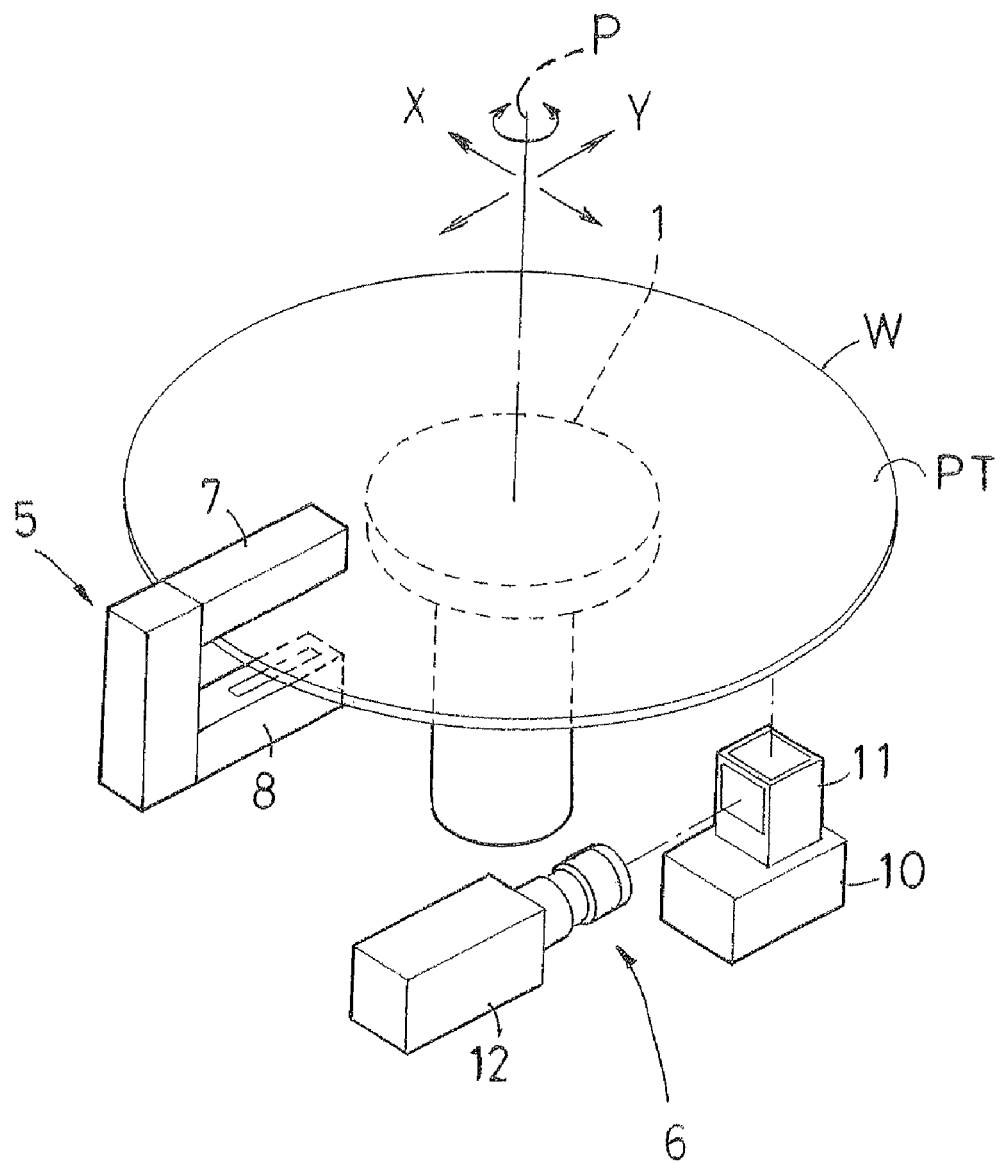
FIG. 1 is a perspective view showing main components of an aligner.
Figure 2:
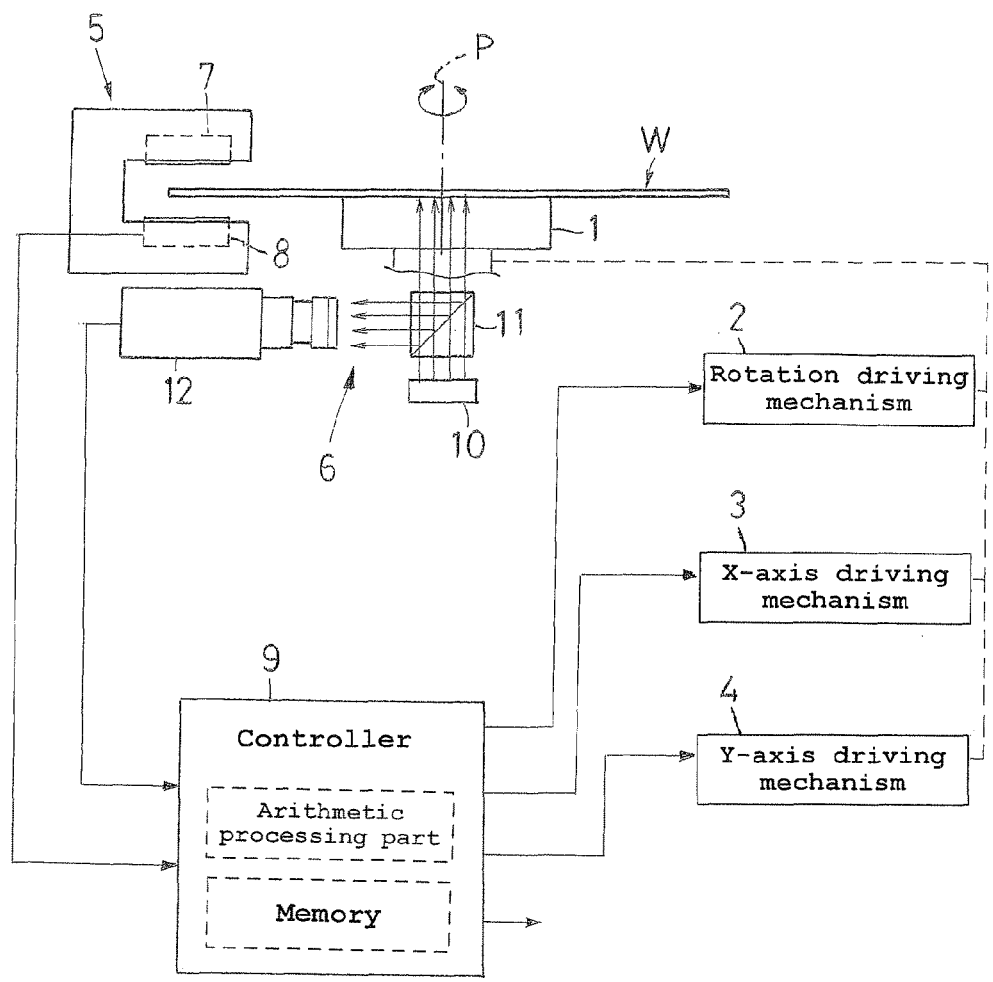
FIG. 2 shows a linkup in the aligner.
Figure 5:
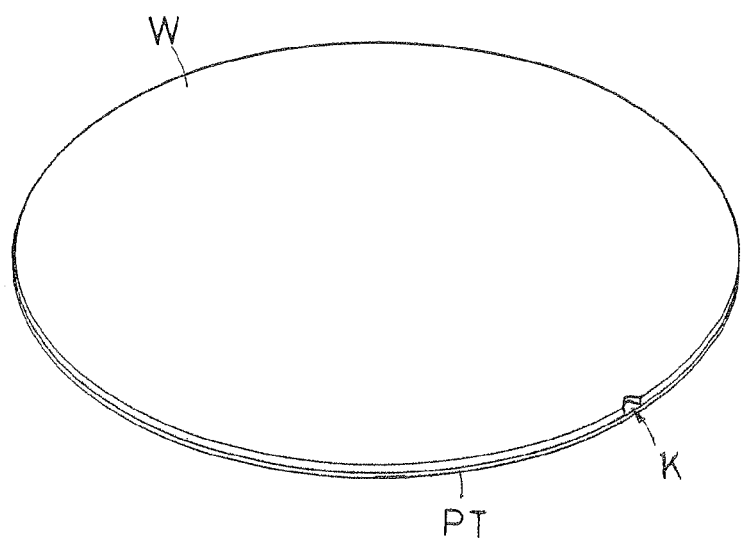
FIG. 5 is a perspective view showing a back face of the semiconductor wafer.
Figure 6:
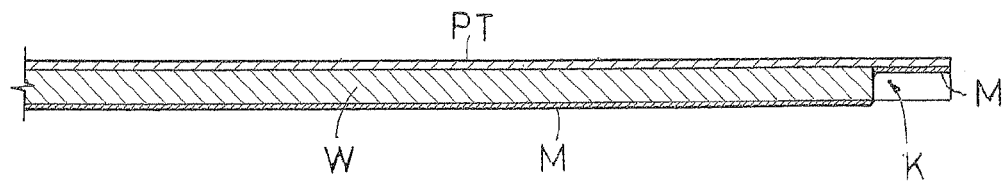
FIG. 6 is an enlarged sectional view showing a notch of the semiconductor wafer.

FIG. 1 is a perspective view showing main components of an aligner for use in alignment of a semiconductor wafer (hereinafter, simply referred to as a wafer) W. FIG. 2 shows a linkup in the aligner. FIG. 5 is a perspective view showing a back face of the wafer W to be subjected to processes. FIG. 6 is a sectional view partially showing the wafer W.

As shown in FIGS. 5 and 6, the wafer W has a front face on which a circuit pattern is formed, and a protective tape PT is joined to the front face. In this state, a back face of the wafer W is subjected to grinding, and then a metal layer M is deposited on the back face. Accordingly, the metal layer M is also deposited on the bared protective tape PT at a portion corresponding to a notch K formed as an alignment site at an outer periphery of the wafer W.

As shown in FIGS. 1 and 2, the aligner is rotatable about a vertical axis center P by means of a rotation driving mechanism 2 such as a pulse motor. The aligner is provided with an aligner stage 1 movable horizontally in an X-axis direction and a Y-axis direction, which are orthogonal to each other, by means of an X-axis driving mechanism 3 and a Y-axis driving mechanism 4. The wafer W is transported to the aligner stage 1 with the front face protected by the protective tape PT being directed upward, and the aligner stage 1 suction holds the wafer W.

A peripheral edge measuring mechanism 5 of a light transmission type, which serves as a first detecting device, is provided at a predetermined position of the aligner stage 1 in a circumferential direction. A defect detecting mechanism 6 of a light reflection type, which serves as a second detecting device, is provided at another predetermined position of the aligner stage 1 in the circumferential direction.

The peripheral edge measuring mechanism 5 includes a light source 7 and a light receiving sensor 8. The light source 7 emits a light beam to the wafer W from above. The light receiving sensor 8 is provided below the wafer W so as to be opposed to the light source 7. The light receiving sensor 8 to be used herein is a CCD line sensor that includes a large number of light receiving elements arranged linearly in a radial direction of the wafer W. The light receiving sensor 8 acquires detection data, and a controller 9 that incorporates a microcomputer receives the detection data.

The defect detecting mechanism 6 includes a light source 10, a polarized beam splitter 11 and a CCD camera 12. The light source 10 emits a light beam perpendicularly to the back face of the wafer W (in a down-to-up direction in FIG. 1). The polarized beam splitter 11 totally reflects the light beam from the light source 10 perpendicularly from the back face of the wafer W such that the light beam passes a return optical path identical to an emission light path, and changes a direction of the reflected light beam perpendicularly (a leftward direction in FIG. 1). The CCD camera 12 receives the reflected light beam guided horizontally by the polarized beam splitter 11. The controller 9 includes a storing device such as memory that stores data of an image captured by the CCD camera 12.

Figure 3:
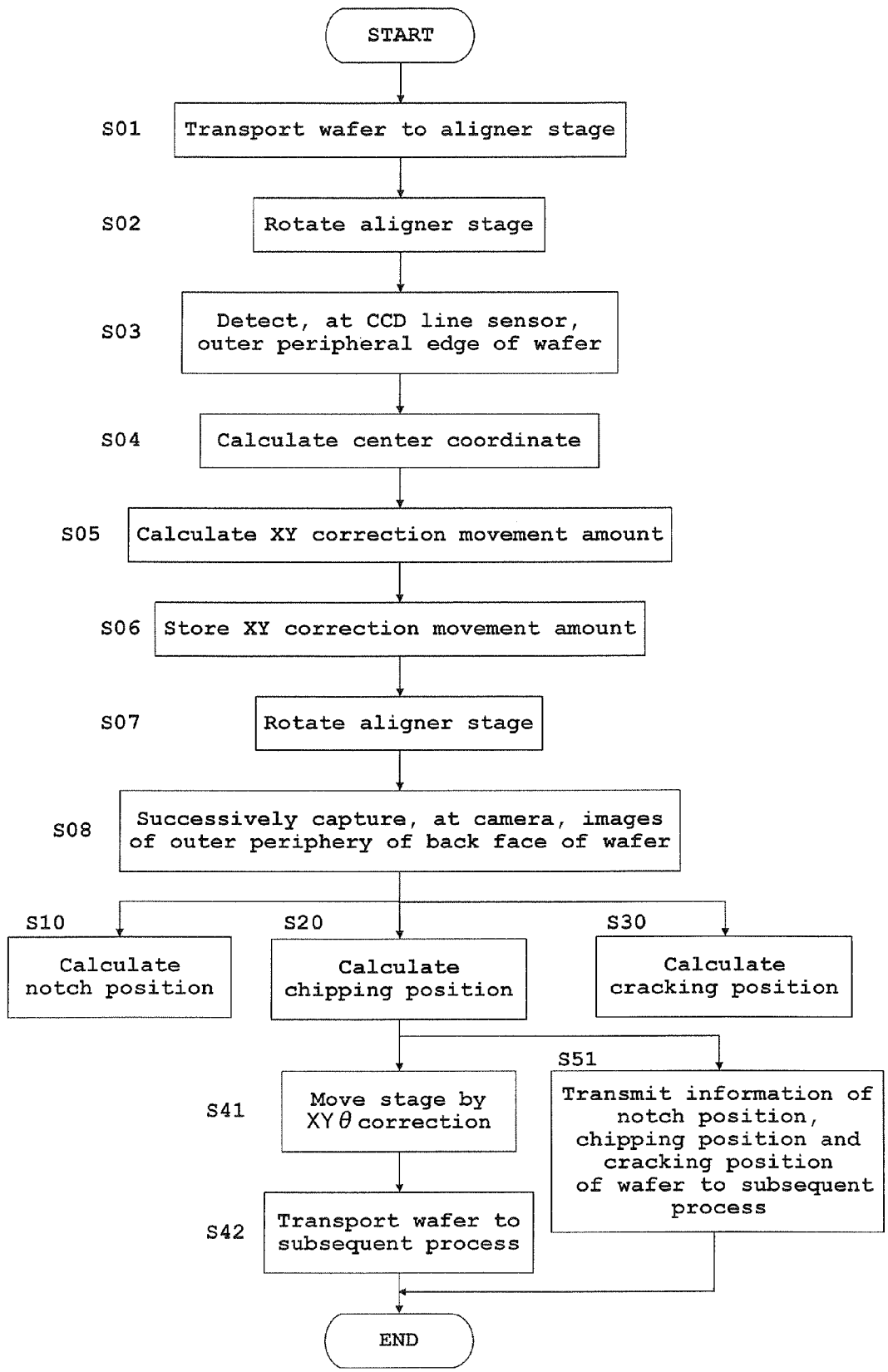
FIG. 3 is a flowchart entirely showing a procedure of processes for a semiconductor wafer.
Figure 4:
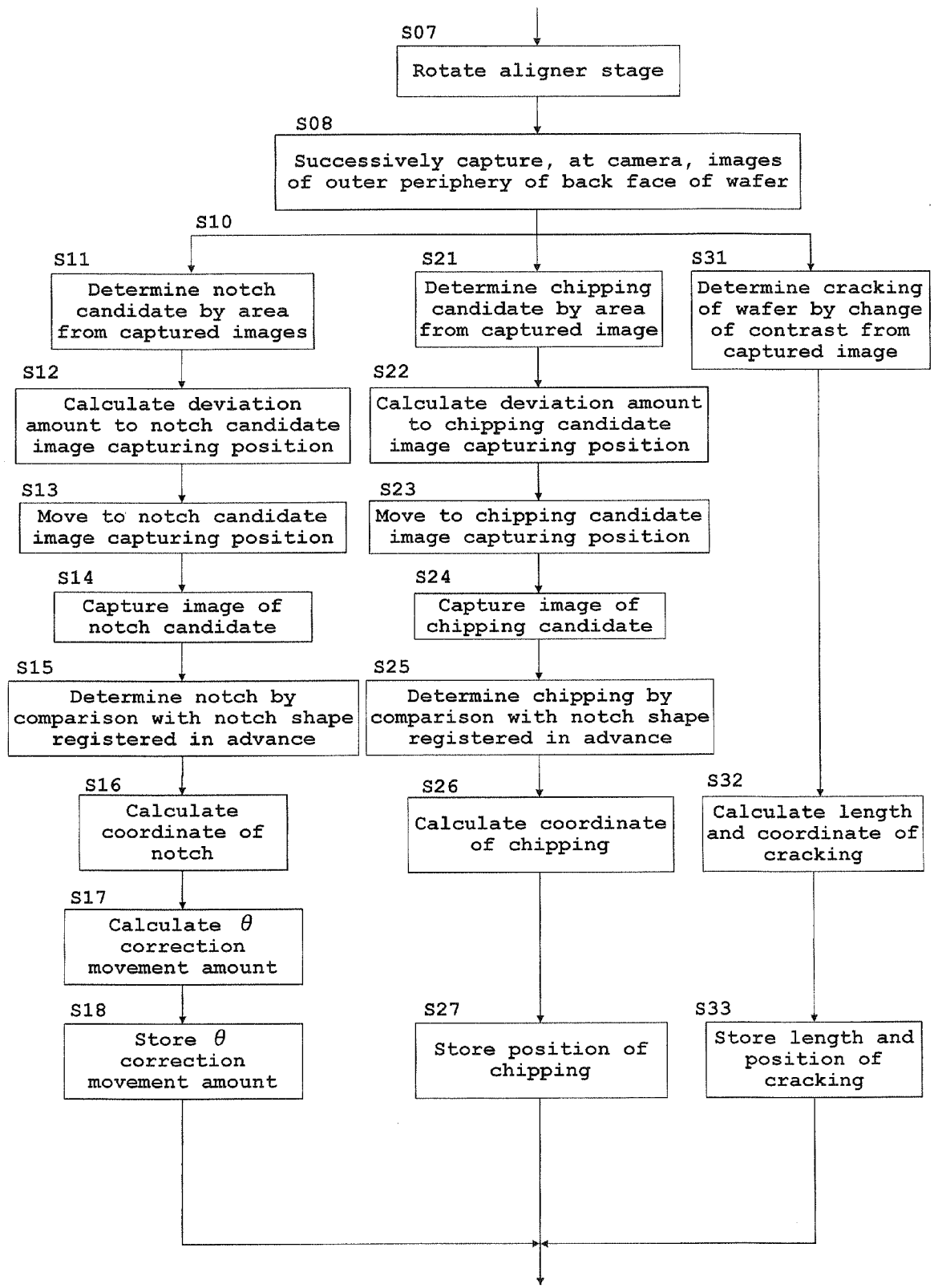
FIG. 4 is a flowchart partially showing the procedure of processes.

The aligner is configured as described above. With reference to flowcharts in FIGS. 3 and 4, next, description will be given of a wafer aligning process and a defect detecting process each executed with the use of the aligner.

First, an appropriate handling device such as a robot arm places the wafer W on the aligner stage 1 with the front face having the protective tape PT joined thereto being directed upward. The aligner stage 1 suction holds the wafer W placed thereon (step S01).

Next, the rotation driving mechanism 2 allows the aligner stage 1 to rotate by 360° at a predetermined speed in a predetermined direction (step S02). Simultaneously, the light receiving sensor (the CCD line sensor) 8 of the peripheral edge measuring mechanism 5 detects the outer peripheral edge of the wafer W to measure and store a position of the outer peripheral edge at each rotational phase (step S03).

The controller 9 calculates a center position of the wafer W as a coordinate position (a center coordinate) on an XY coordinate, on the basis of the measured and stored data (step S04).

The controller 9 also calculates, as an XY correction movement amount, a deviation of the center coordinate of the wafer W from the center of the aligner stage 1 (step S05). The storing device such as the memory in the controller 9 stores this correction movement amount (step S06).

Next, the rotation driving mechanism 2 allows the aligner stage 1 to rotate at the predetermined speed (step S07). Herein, the light source 10 emits a light beam to the back face (the bottom side) of the outer periphery of the wafer W, and the CCD camera 12 successively captures images of the light beam which is reflected totally from the back face of the wafer W and passes the return optical path identical to the emission optical path. The memory or the like in the controller 9 stores data of the captured image (step S08). An arithmetic processing part in the controller 9 executes a notch position calculating process (step S10), a chip position calculating process (step S20) and a crack position calculating process (step S30) in parallel, on the basis of the acquired image data. With reference to the flowchart in FIG. 4, next, description will be given of the respective calculating processes.

<Notch Position Calculating Process (step S10)>

The arithmetic processing part determines a candidate supposed as the notch K as a coincident portion by an area comparison from the images successively captured by the CCD camera 12 (step S11). The image utilized herein is obtained by reception of a substantially total amount of the light beam which is emitted from the light source 10 and is reflected from the back face of the wafer W. Accordingly, the normal portion of the back face of the wafer W is highlighted in white. On the other hand, the notch, the chip and the crack on the outer peripheral edge of the wafer W as well as the outer peripheral region of the wafer W are represented in black.

Next, the arithmetic processing part calculates a deviation amount (an angle of rotation) from an image capturing start position to a position of the notch candidate (step S12). On the basis of a result of the calculation, the rotation driving mechanism 2 allows the aligner stage 1 to rotate by the deviation amount such that the notch candidate is aligned with an image capturing position (step S13).

When the notch candidate is aligned with the image capturing position, the CCD camera 12 captures an image of the notch candidate again (step S14). Then, the arithmetic processing part compares the notch candidate with a notch shape registered in advance by pattern matching or the like to determine the notch K (step S15).

When the notch K is determined, the arithmetic processing part calculates a coordinate of a position of the notch K (step S16). On the basis of this coordinate data, the arithmetic processing part calculates a correction movement amount θ for moving the notch K to a preset reference position (a rotational phase) (step S17). Then, the memory or the like in the controller 9 stores the correction movement amount θ (step S18).

<Chip Position Calculating Process (step S20)>

The arithmetic processing part determines a candidate supposed as a chip by an area comparison from the images successively captured by the CCD camera 12 (step S21).

Next, the arithmetic processing part calculates a deviation amount (an angle of rotation) from the image capturing start position to a position of the chip candidate (step S22). On the basis of a result of the calculation, the rotation driving mechanism 2 allows the aligner stage 1 to rotate by the deviation amount such that the chip candidate is aligned with the image capturing position (step S23).

When the chip candidate is aligned with the image capturing position, the CCD camera 12 captures an image of the chip candidate again (step S24). Then, the arithmetic processing part compares the chip candidate with the notch shape registered in advance by pattern matching or the like to determine the chip from a result of the pattern matching (step S25).

When the chip is determined, the arithmetic processing part calculates a coordinate of a position of the chip (step S26). Then, the memory or the like in the controller 9 stores the coordinate (step S27).

<Cracking Position Calculating Process (step S30)>

The arithmetic processing part determines a crack on the wafer W by a change of concentration from the images successively captured by the CCD camera 12 (step S31). The image utilized herein is obtained by reception of a substantially total amount of the light beam emitted from the light source 10 and then reflected from the back face of the wafer W. Accordingly, the normal portion of the back face of the wafer W is highlighted in white. On the other hand, the notch, the chip and the crack on the outer peripheral edge of the wafer W as well as the outer peripheral region of the wafer W are represented in black. That is, an influence of irregular reflection caused by characteristics of the back face of the wafer W is eliminated, so that the minute crack is displayed clearly on the image of the back face of the wafer W represented in white.

When the crack on the wafer W is determined, the arithmetic processing part calculates a length and a coordinate position of the crack (step S32). Then, the memory or the like in the controller 9 stores a result of the calculation (step S33).

After completion of the processes described above, the arithmetic processing part executes a wafer aligning process and a detection information transmitting process.

In the wafer aligning process, the rotation driving mechanism 2 allows the aligner stage 1 to move horizontally on the X-Y plane shown in FIG. 1, on the basis of the XY correction movement amount stored in the memory or the like. Simultaneously, the rotation driving mechanism 2 allows the aligner stage 1 to rotate on the basis of the correction movement amount θ. As a result, the wafer W is corrected such that the center position is aligned with the reference position and the notch K is directed to the reference rotational phase in a predetermined posture (step S41). Thereafter, the wafer W is transported from the aligner stage 1 to a subsequent process (step S42).

In the detection information transmitting process, detection information such as the position of the notch, the position of the chip on the wafer, and the position of the crack on the wafer are transmitted to each controller in each process through a network or a recording medium. Alternatively, a label having the position information recorded therein while being coded two-dimensionally or three-dimensionally is attached to the wafer W (step S51).

Next, description will be given of one example of a process in a case where chip or crack on a wafer W is detected.

Figure 7:
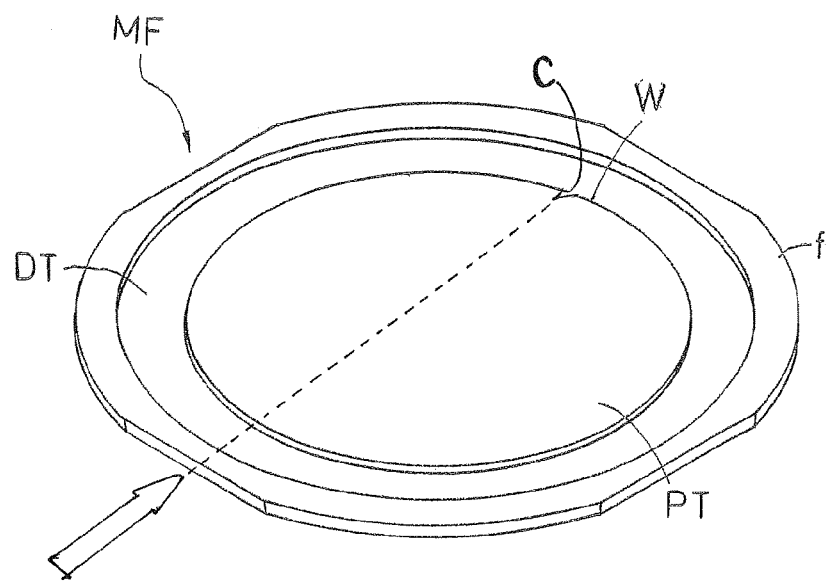
FIG. 7 is a perspective view showing a mount frame.

A wafer W subjected to back grinding is attached to and held by a ring frame f through a dicing tape DT; thus, a mount frame MF shown in FIG. 7 is prepared. In this case, the position information transmitted from the previous process is utilized.

If the wafer W has a chip or a crack detected at a region corresponding to the outer periphery of the circuit pattern, the position information of the chip or the like is read by the controller in each process. On the basis of this position information, the portion having no chip or crack is set as a tape joining direction. For example, the tape joining direction (a joining roller moving direction) is set such that the chip or the crack is located at a tape joining termination end side which is set in a direction of joining the dicing tape DT shown by an arrow mark in FIG. 7. That is, the chipped portions are compared with each other, and a position of the larger one is preferentially set as the tape joining termination end side. Alternatively, the tape joining direction is set along a longitudinal direction of the crac. After the setting of the tape joining direction, the following operation is performed. That is, when a joining roller rolls on a protective tape PT while being pressed against a non-adhesion side of the protective tape PT, a portion having no crack or the like is reinforced by the protective tape PT in advance. Thereafter, a pressing force of the joining roller is applied only to a portion corresponding to the crack or the like. Accordingly, this configuration allows reduction of a tape joining stress to be applied to the wafer W, leading to prevention of further deterioration of the chip and the crack.

Figure 8:
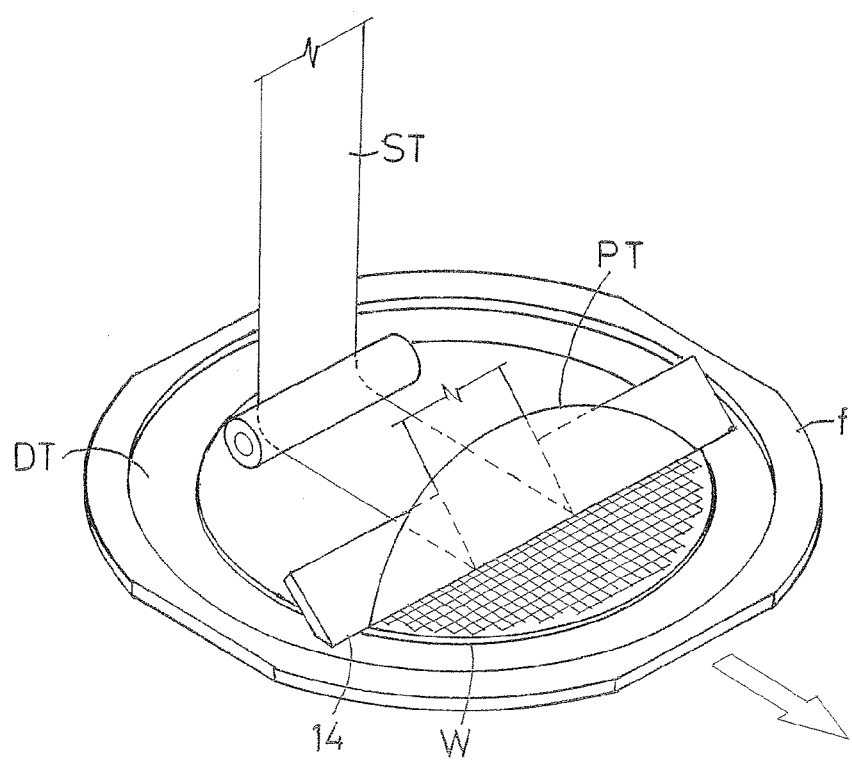
FIG. 8 is a perspective view showing a protective tape separating process.

In order to attach the wafer W to the ring frame f through the dicing tape DT and, then, separate the protective tape PT from the front face of the wafer W, the following process is executed. As shown in FIG. 8, for example, the mount frame MF is placed on a holding table (not shown). When the holding table moves in a direction shown by an arrow mark while holding the mount frame MF, the separating tape ST having a narrow width is joined to the protective tape PT by an edge member 14 and, almost simultaneously, is folded back and collected with the use of a tip end of the edge member 14. Thus, the protective tape PT can be separated together with the separating tape ST from the front face of the wafer W.

In this separating process, if chip or crack is detected on the wafer W, a portion having no chip or crack is set as a tape separating direction as in the case of joining of the dicing tape DT. That is, the joining direction of the separating tape ST (the moving direction of the edge member 14) is set such that the chip or the crack is located at the tape joining termination end side. In the case shown in FIG. 8, the chip or the crack on the wafer W is located at a position opposite to a traveling direction shown by an arrow mark. The joining of the separating tape ST allows reduction of a tape separating stress and a pressing force of the edge member 14 each applied to the chip of the wafer W and reduction of a separating stress generated upon separation of the separating tape ST (i.e., suppression of a degree of warpage).

For example, in a case where the chip is located at the separation termination end position, the following operation is performed. When the separating tape ST joined from the joining start end reaches the position of the chip, a distance of joining the protective tape ST corresponds to the chip. In other words, the wafer W is not damaged from the chip after the position of the chip. Accordingly, it is possible to prevent further deterioration of chip or crack of the wafer W upon separation of the separating tape ST.

In a case of occurring the crack, the following operation is performed. Typically, if the longitudinal direction of the crack is coincide with a separation contact of the edge member 14, that is, if the longitudinal direction of the edge member is equal to the longitudinal direction of the crack, the wafer W is readily bent from the crack due to the separating stress of the edge member 14. However, the edge member 14 intersects the longitudinal direction of the crack and the protective tape PT is separated along the crack in this state; thus, such a disadvantage can be prevented. Moreover, the separation starting from the center of the longitudinal crack in a radial direction (outward) allows suppression of a degree of warpage of the wafer W upon separation of the separating tape ST and prevention of further deterioration of the crack.

The present invention is not particularly limited to the embodiment described above, and may be modified as follows.

(1) In the foregoing embodiment, the first detecting device 5 that utilizes the CCD line sensor 8 determines the center position of the wafer W. However, the center position of the wafer W may be determined by an imaging process using a CCD camera.

(2) In the foregoing embodiment, the notch position calculating process, the chip position calculating process and the crack position calculating processes are executed in parallel. However, these processes may be executed in sequence.

(3) In the foregoing embodiment, the light beam is emitted perpendicularly to the back face of the wafer W. However, the light beam may be emitted to the front face having a circuit pattern formed thereon.

(4) In the foregoing embodiment, the joining position and the separating direction of the separating tape ST are not particularly limited to those described in the foregoing embodiment. It is preferable that the joining position is a position except a position of a chip or a crack and the separating direction is a direction capable of suppressing deterioration of the chip or the crack.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for joining an adhesive tape to a semiconductor wafer, comprising the steps of:
   detecting a position of a defect occurring at an outer periphery of the semiconductor wafer by emitting a light beam perpendicularly to a back face of the semiconductor wafer, successively capturing images of the light beam, which is reflected totally from the back face of the wafer and passes a return optical path identical to an emission optical path, with a CCD camera, and calculating the position of the defect with an arithmetic processing part using the captured images, and then storing the position of the defect in a memory part of a controller; and
   determining a direction of joining the adhesive tape to the semiconductor wafer by reading the stored information of the defect position with the controller.

2. The method for joining the adhesive tape to the semiconductor wafer according to claim 1, wherein
   the direction of joining the adhesive tape is determined diametrical from a position except the defect position.

3. The method for joining the adhesive tape to the semiconductor wafer according to claim 1, wherein
   a plurality of defects are present at the outer periphery of the semiconductor wafer, and the direction of joining the adhesive tape is determined diametrical from a position except a defect with a wider area, the defect being derived from a comparison among areas of the defects.

4. The method for joining the adhesive tape to the semiconductor wafer according to claim 1, wherein
   the defect is a crack, and the adhesive tape is joined from a position except the crack, the position being defined as a joining start position, and the direction of joining the adhesive tape is determined parallel to a longitudinal direction of the crack.

5. A method for separating a protective tape from a semiconductor wafer, comprising the steps of:
   detecting a position of a defect at an outer periphery of the semiconductor wafer by emitting a light beam perpendicularly to a back face of the semiconductor wafer, successively capturing images of the light beam, which is reflected totally from the back face of the wafer and passes a return optical path identical to an emission optical path, with a CCD camera, and calculating the position of the defect with an arithmetic processing part using the captured images, and then storing the position of the defect in a memory part of a controller; and
   determining a direction of separating the protective tape from a pattern formation side of the semiconductor wafer by reading the stored information of the defect position with the controller.

6. The method for separating the protective tape from the semiconductor wafer according to claim 5, wherein
   the direction of separating the protective tape is determined diametrical from a position except the defect position.

7. The method for separating the protective tape from the semiconductor wafer according to claim 5, wherein
   a plurality of defects are present at the outer periphery of the semiconductor wafer, and the direction of separating the adhesive tape is determined diametrical from a position except a defect with a wider area, the defect being derived from a comparison among areas of the defects.

8. The method for separating the protective tape from the semiconductor wafer according to claim 5, wherein
   the defect is a crack, and the adhesive tape is separated from a position except the crack, the position being defined as a separating start position, and the direction of separating the adhesive tape is determined parallel to a longitudinal direction of the crack.

* * * * *